(12) United States Patent
Futakuchiya et al.

(10) Patent No.: US 7,851,728 B2
(45) Date of Patent: Dec. 14, 2010

(54) HEATER UNIT

(75) Inventors: Jun Futakuchiya, Isehara (JP); Toshihiro Tachikawa, Isehara (JP)

(73) Assignee: NHK Spring Co., Ltd, Yokohama-shi, Kanagawa (JP)

( * ) Notice: Subject to any disclaimer, the term of this patent is extended or adjusted under 35 U.S.C. 154(b) by 387 days.

(21) Appl. No.: 11/819,155

(22) Filed: Jun. 25, 2007

(65) Prior Publication Data

US 2008/0006618 A1    Jan. 10, 2008

(30) Foreign Application Priority Data

Jul. 7, 2006    (JP) .............................. 2006-188641

(51) Int. Cl.
*H05B 3/68* (2006.01)
*C23C 16/00* (2006.01)

(52) U.S. Cl. .................................... 219/444.1; 118/725

(58) Field of Classification Search ... 219/443.1–468.2, 219/391; 118/724, 725
See application file for complete search history.

(56) References Cited

U.S. PATENT DOCUMENTS 5,994,678 A * 11/1999 Zhao et al. .................. 219/530
7,045,747 B2    5/2006 Futakuchiya et al.
7,126,093 B2 * 10/2006 Goto et al. ............... 219/444.1

FOREIGN PATENT DOCUMENTS

JP    2005-216759    8/2005

* cited by examiner

*Primary Examiner*—Sang Y Paik
(74) *Attorney, Agent, or Firm*—Nixon Peabody LLP; Jeffrey L. Costellia (57) ABSTRACT

The present invention provides a heater unit which can improve temperature uniformity of a heated object at the time of heating the object. A second heat conductor 32 which is the radial internal part of shaft 22 has a lower heat transfer ratio than a first heat conductor 30 which is the radial external part of shaft 22. As a result, in the case where a heated state and a non heated state of the resistance heating element 18 are repeatedly switched, the movement of heat from the front part 22B of the shaft 22 to the base point part 22A is suppressed by the second heat conductor 32 compared to the first heat conductor 30. As a result, in the part which confronts the hollow part 42 of the shaft 22 in the heater plate 16, the time required to heat the heater plate 16 and the wafer 28 to be heated to a desired heating temperature is shortened when compared to a conventional heater unit. Therefore, it is possible to improve the uniformity of the temperature of the wafer 28 which is to be heated by the heater plate 16.

20 Claims, 11 Drawing Sheets

HEATER UNIT

CROSS-REFERENCE TO RELATED APPLICATIONS

This application is based upon and claims the benefit of priority from the prior Japanese Patent Application No. 2006-188641, filed on Jul. 7, 2006, the entire contents of which are incorporated herein by reference.

BACKGROUND OF THE INVENTION

1. Field of the Invention

This invention relates to a heater unit which heats an object to be heated such as a semiconductor substrate for example.

2. Description of the Related Art

A heater unit is proposed which heats a wafer which is a semiconductor substrate, for example, and an example of this is revealed in a patent document, Japanese Laid-Open patent Publication No. 2005-216759.

In this type of heater unit, a heater plate is supported by a shaft part and a resistance heating element is routed through the inner section of the heater plate passing through the shaft part. It is a mechanism whereby when a current is passed along the resistance heating element, the resistance heating element generates heat and by this heat a wafer mounted on the heater plate is heated.

However, when repeatedly switching between a heated state and a non heated state of the resistance heating element by controlling the current passed through the resistance heating element, more time is required to heat the area which confronts the hollow area (the opening formed in the direction of the shaft's axis) which is formed in the shaft within the heater plate until a desired heating temperature than to heat other areas. As a result, the temperature of the wafer which is mounted on the plate differs in horizontal direction.

In consideration of the above stated fact, this invention aims to obtain a heater unit which can improve uniformity in the temperature of an object concerned at the time of heating the object to be heated.

BRIEF SUMMARY OF THE INVENTION

In an aspect of the present invention cited in claim 1, a heater unit comprises a heater plate which has a heating element. The heating element is able to be switched between a heated state and a non heated state and the heater plate heats an object to be heated by making the heating element a heated state. The heater unit is equipped with a shaft which is roughly a tube shape. The shaft has a radial external part which is formed by a first heat conductor and a radial internal part which is formed by a second heat conductor. Heat conduction ratio of the second heat conductor is lower than that of the first heat conductor. One end part of the shaft is engaged with the heater plate and supports the heater plate.

In the aspect cited in claim 1, the second heat conductor, which is the radial internal part of the shaft, has a lower heat conduction ratio than the first heat conductor, which is the radial external part of the shaft. As a result of this, in the case where the heating element is repeatedly switched between a heated state and a non-heated state, the movement of heat from one end part of the shaft (heater plate side) to the other end part is suppressed more in the second heat conductor compared to the first heat conductor. As a result of this, in the area which confronts the hollow area (the opening formed in the direction of the shaft's axis) formed within the shaft in the heater plate, the time required to heat the heater plate and in addition an object to be heated until a desired heating temperature is shortened when compared to a conventional heater unit. Consequently, it is possible to improve uniformity of the temperature of the object to be heated by the heater plate.

Another aspect of the present invention cited in claim 2 is characterized by a flange part which is arranged at one end part of the shaft and which engages the heater plate in the aspect cited in claim 1.

In the aspect cited in claim 2, the flange part is arranged at one end part of the shaft. As a result, when the flange part is engaged by the heater plate, for example, the heater plate is placed the engagement part up, and then, one end part of the shaft is aligned and engaged with the engagement part of the placed heater plate. Therefore, for example, in the case where the shaft is joined to the heater plate by welding or soldering, a component which fixes the heater place is no longer necessary and by this the shaft can easily be joined to the heater plate.

In another aspect of the present invention cited in claim 3, the heater unit of the aspect cited in claim 1 is characterized in that the shaft has an expanded diameter part whose diameter is wider than the middle section of the shaft and is arranged at the other end of the shaft. The expanded diameter part has an O ring groove which is interlocked with an O ring. The O ring groove is separated from the second heat conductor and is arranged on the side of the other end part of the shaft rather than the second heat conductor within the expanded diameter part.

In the aspect cited in claim 3, the O ring groove is arranged in the direction of the shaft axis closer to the other end part of the shaft than the second heat conductor within the expanded diameter part. As a result, the heat which moved to the other end part from one end part (heater plate side) is maintained by the second heat conductor within the expanded diameter part, and because the heat deformation of the O ring which is interlocked with the O ring groove is reduced, cooling of this O ring is no longer necessary. Therefore, a member with an allowable temperature limit lower than that of conventional one can be applied as an O ring which is interlocked with the O ring groove.

In another aspect of the present invention cited in claim 4, the heater unit of the aspect cited in claim 1 is characterized in that the shaft is arranged with a flange part which is engaged with the heater plate at one end of the shaft. The shaft has an expanded diameter part whose diameter is wider than the middle section of the shaft and is arranged at the other of the shaft. The expanded diameter part is arranged with an O ring groove interlocked with an O ring. The O ring groove is separated from the second heat conductor and arranged closer to the other end part of the shaft than the second heat conductor within the expanded diameter part.

In the aspect cited in claim 4, the flange part is arranged at one end of the shaft. Because of this, when the flange part is engaged with the heater plate, for example, the heater plate is placed the engagement part for engaging with the shaft upside and one end part of the shaft is aligned and engaged with the engagement part of the heater plate. Therefore, for example, in the case where the shaft is joined to the heater plate by welding or soldering, a component which fixes the heater place is no longer necessary and by this the shaft can easily be joined to the heater plate.

Also, the O ring groove of the expanded diameter part is arranged in the direction of the shaft axis closer to the other end part of the shaft than the second heat conductor within the expanded diameter part. As a result, the heat which moved to the other end part from one end part (heater plate side) is maintained by the second heat conductor within the expanded diameter part, and because the heat deformation of the O ring which is interlocked with the O ring groove is controlled, cooling of this O ring is no longer necessary. Therefore, a thing with an allowable temperature limit lower than that of conventional member can be applied as an O ring which is interlocked with the O ring groove.

In another aspect of the present invention cited in claim 5 is characterized by the extended diameter part whose diameter dimensions are smaller than the diameter dimensions of the flange part in the invention cited in claim 4.

In the aspect cited in claim 5, the diameter dimensions of the extended diameter part are smaller than the diameter dimensions of the flange part. As a result, for example, in the case where the shaft is joined to the heater plate by electron beam welding, it is possible to emit the electron beam in order to weld along the direction of the shaft axis facing the flange part from the other end part of the shaft rather than the extended diameter part. Therefore, the joining of the shaft and heater plate becomes even easier.

In another aspect of the present invention cited in claim 6, the heater unit of the aspect cited in claim 1 is characterized in that the surface position of the second heat conductor at one end of the shaft is made to be closer to the side of the other end of the shaft rather than the surface position of the first heat conductor at one end of the shaft. In another aspect of the present invention, the heater unit of the aspect cited in claim 2 is characterized in that the surface position of the second heat conductor at one end of the shaft is made to be closer to the side of the other end of the shaft rather than the surface position of the first heat conductor at one end of the shaft. In another aspect of the present invention, the heater unit of the aspect cited in claim 3 is characterized in that the surface position of the second heat conductor at one end of the shaft is made to be closer to the side of the other end of the shaft rather than the surface position of the first heat conductor at one end of the shaft. In another aspect of the present invention cited in claim 4, the heater unit of the aspect cited in claim 1 is characterized in that the surface position of the second heat conductor at one end of the shaft is made to be closer to the side of the other end of the shaft rather than the surface position of the first heat conductor at one end of the shaft.

In another aspect of the present invention, the heater unit of the aspect cited in claim 5 is characterized in that the surface position of the second heat conductor at one end of the shaft is made to be closer to the side of the other end of the shaft rather than the surface position of the first heat conductor at one end of the shaft.

In the aspect cited in claim 6, in one end part of the shaft, the surface position of the second heat conductor is made to be sagged towards the other end part of the shaft so that the surface position of the second heat conductor is closer to the other end part of the shaft than the surface position of the first heat conductor. As a result, for example, in the case where the second heat conductor and the heater plate are separated, the movement of heat between the heater plate and the second heat conductor is suppressed. Therefore, even if the heating element is switched from a heated state to a non-heated state it is difficult for the once heated second heat conductor to become cold and also after this even if the heating element is switched from a non-heated state to a heated state, time required to heat an area of the heater plate, the area confronting the hollow part of the shaft until a desired temperature becomes shorter than conventional. Consequently, the area which confronts the hollow part (the opening formed in the direction of the shaft's axis) which is formed within the shaft in the heater plate is quickly heated until the desired temperature.

In another aspect of the present invention cited in claim 7, the heater unit of the aspect cited in claim 1 is characterized in that the second heat conductor has a projection part which projects out towards the exterior of the shafts diameter. A concave part of the first heat conductor accommodates the projection, and the wall thickness size of the concave part is smaller than the other part which does not accommodate the projection part. In another aspect of the present invention, the heater unit of the aspect cited in claim 2 is characterized in that the second heat conductor has a projection part which projects out towards the exterior of the shafts diameter. A concave part of the first heat conductor accommodates the projection, and the wall thickness size of the concave part is smaller than the other part which does not accommodate the projection part. In another aspect of the present invention, the heater unit of the aspect cited in claim 3 is characterized in that the second heat conductor has a projection part which projects out towards the exterior of the shafts diameter. A concave part of the first heat conductor accommodates the projection, and the wall thickness size of the concave part is smaller than the other part which does not accommodate the projection part. In another aspect of the present invention, the heater unit of the aspect cited in claim 4 is characterized in that the second heat conductor has a projection part which projects out towards the exterior of the shafts diameter. A concave part of the first heat conductor accommodates the projection, and the wall thickness size of the concave part is smaller than the other part which does not accommodate the projection part. In another aspect of the present invention, the heater unit of the aspect cited in claim 5 is characterized in that the second heat conductor has a projection part which projects out towards the exterior of the shafts diameter. A concave part of the first heat conductor accommodates the projection, and the wall thickness size of the concave part is smaller than the other part which does not accommodate the projection part. In another aspect of the present invention, the heater unit of the aspect cited in claim 6 is characterized in that the second heat conductor has a projection part which projects out towards the exterior of the shafts diameter. A concave part of the first heat conductor accommodates the projection, and the wall thickness size of the concave part is smaller than the other part which does not accommodate the projection part.

In the aspect cited in claim 7, the projection part of the second heat conductor projects towards the concave part of the first heat conductor and the radial wall thickness size in the concave part of the first heat conductor is smaller than other parts (the parts which do not accommodate the projection part of the second heat conductor among the first heat conductor). As a result, in the concave part of the first heat conductor, compared to the other parts (the parts which do not accommodate the projection part of the second heat conductor among the first heat conductor) the movement of heat from one end part of the shaft (the heater plate side) to the other end part is suppressed. Therefore, in the area which confronts the hollow area (the opening formed in the direction of the shaft's axis) formed within the shaft in the heater plate, the time required to heat the heater plate and an object to be heated until the desired heating temperature is shortened when compared to a conventional heater unit. Consequently, it is possible to further improve uniformity of the temperature of the object to be heated by the heater plate.

According to the present invention, as explained above, the uniformity of temperature of an object to be heated can be improved when the object is heated.

DETAILED DESCRIPTION OF THE INVENTION

Figure 1:
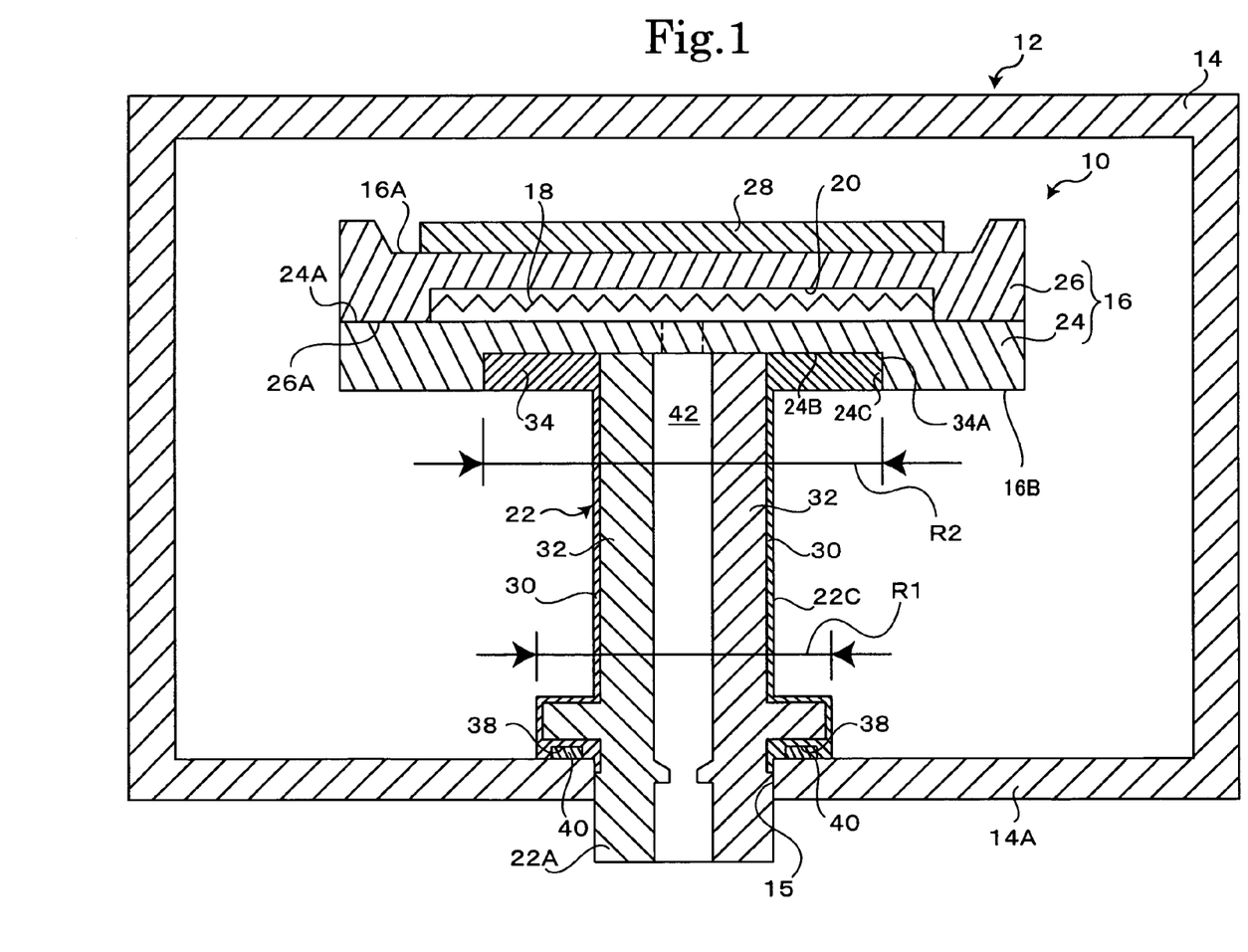
FIG. 1 is a cross sectional diagram which typically shows an outline of a process chamber relating to an embodiment of this invention.

In FIG. 1, a cross section view is typically shown of an outline of a process chamber 12 which is equipped with a heater unit 10 related to an embodiment of this invention. Also, in FIG. 2, a perspective view (part sectional view) of the outline of the heater unit 10 is shown.

The process chamber 12 is a processing device used for example, in a semiconductor manufacturing process which uses a plasma CVD method or a semiconductor manufacturing process which uses a heat CVD method.

This process chamber 12 is equipped, for example, with a rectangular box housing 14. The inside area of the housing 14 is blocked off from the outside (air) and as a result the airtightness of the housing 14 is maintained.

Figure 2:
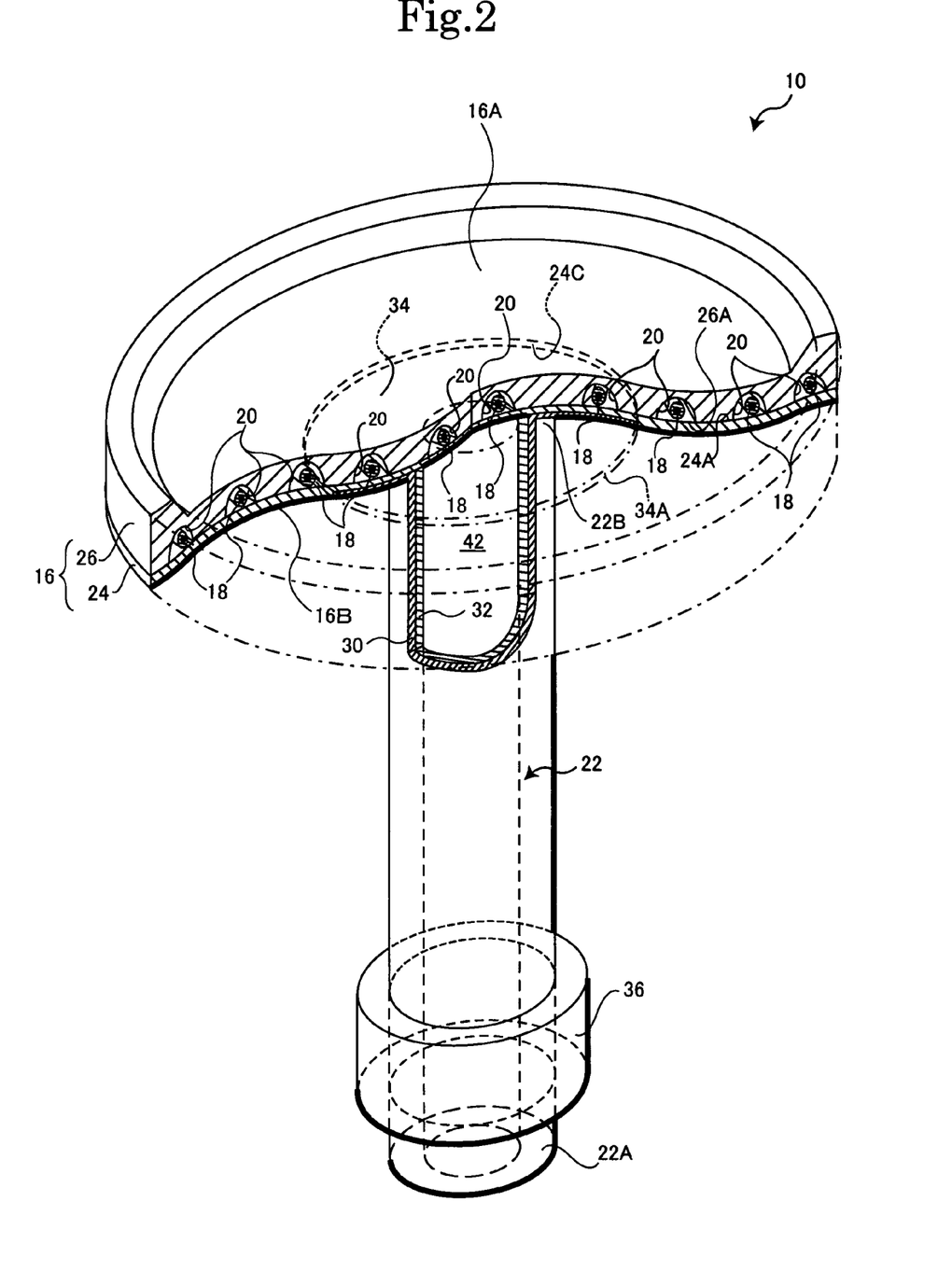
FIG. 2 is a perspective view diagram (one part cross sectional diagram) which typically shows an outline of a heater unit relating to the embodiment of this invention.

A heater unit 10 is housed within this type of housing 14. The heater unit 10 has a roughly disc shaped heater plate 16. The heater plate 16 is made from aluminum for example.

The heater plate 16 is equipped with a roughly disc shaped substrate 24, and a roughly disc shaped plate component 26 is formed on this substrate 24. The plate component 26 is joined with the substrate 24 by welding or soldering a back surface 26A on the side of the substrate 24 (the underside on the side of the substrate 24 of the plate component 26) to a supporting surface of the substrate 24 (the upper surface on the side of the plate component 26 of the substrate 24)

Figure 3:
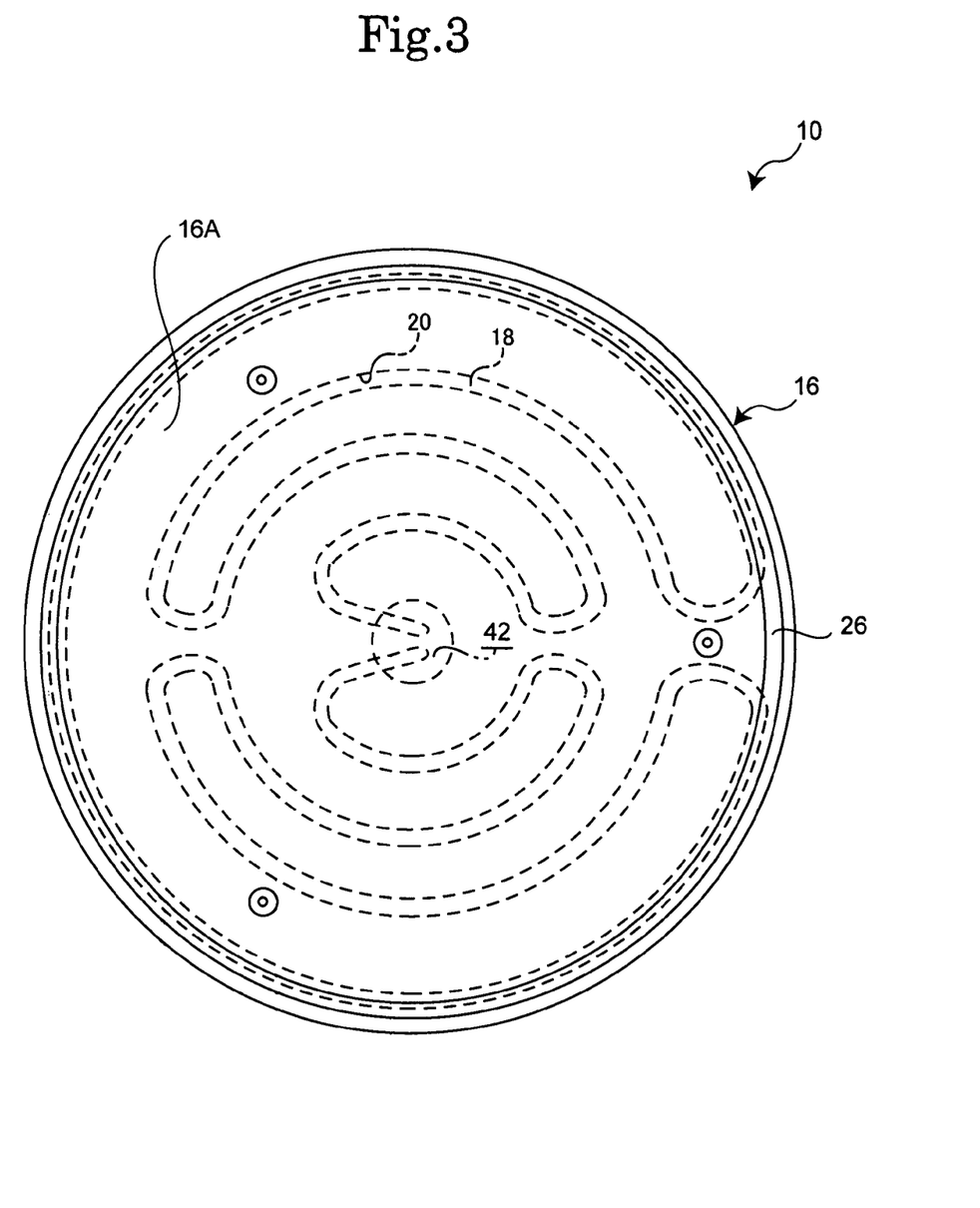
FIG. 3 is a horizontal view diagram of the heater unit relating to the embodiment of this invention.

Also, as shown in FIG. 3, a routed groove 20 is formed on the underside of the plate component 26. A resistance heating element 18 is housed in the routed groove 20 as a heating element and thus the resistance heating element 18 is routed inside the heater plate 16. The resistance heating element 18 is switched from a non-heated state to a heated state by a passing current, and a face surface 16A of the heater plate 16 (the surface on the opposite side to the back side of the plate component 26) can be heated almost uniformly. As a result, the wafer 28 (FIG. 1) is mounted on the face surface 16A of the heater plate 16 and can be heated as the object to be heated.

Also, a roughly cylinder shaped shaft 22 is attached to the back surface 16B (the surface opposite the supporting face 24A of the substrate 24) of the heater plate 16.

Figure 4:
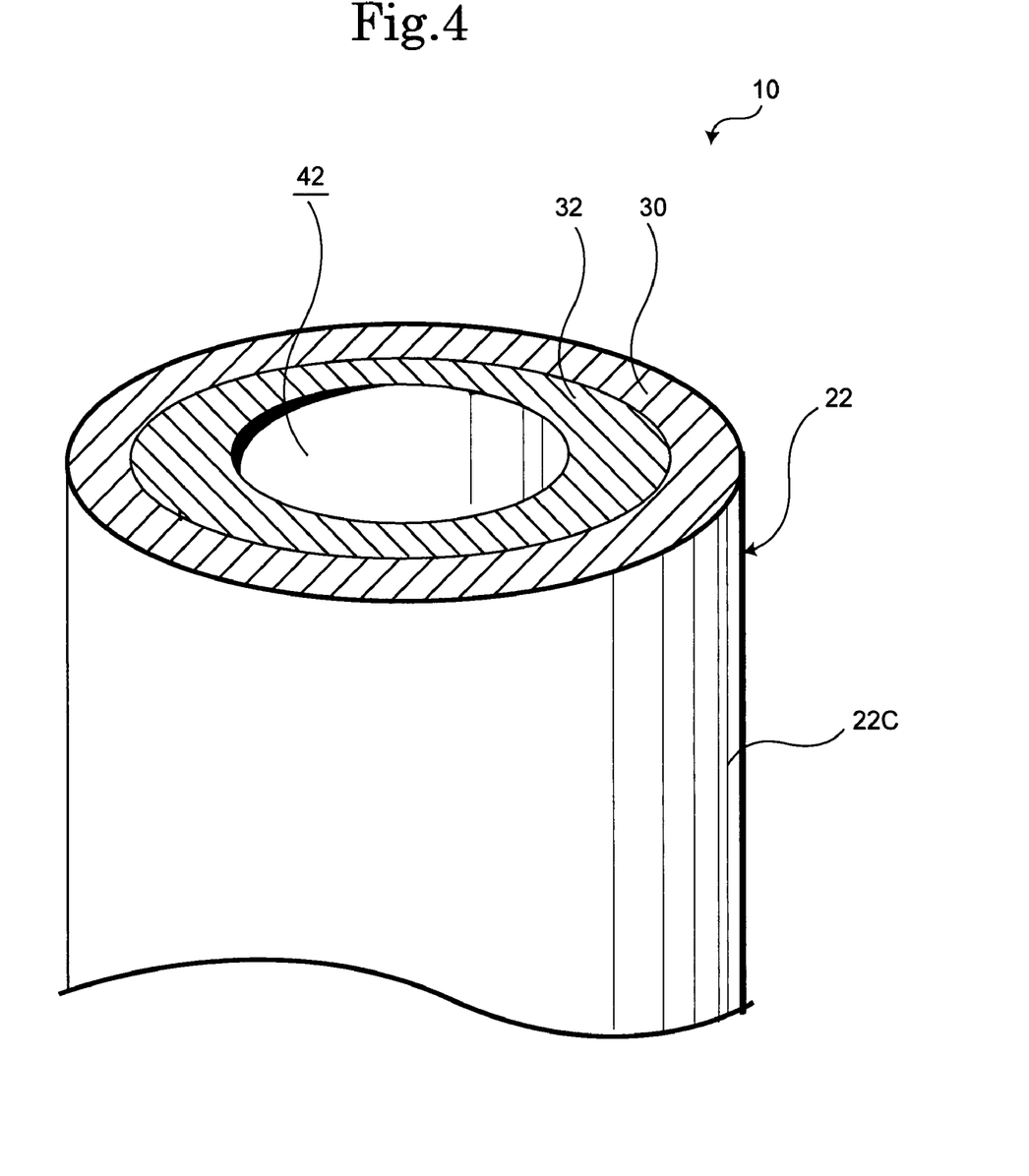
FIG. 4 is perspective view diagram which shows a cross section of the middle part of a shaft relating to the embodiment of this invention.

The radial external part of the shaft 22 is formed by a first heat conductor 30. This first heat conductor 30 can be made of aluminum, for example.

The radial internal part of the shaft 22 is formed by a second heat conductor 32. This radial internal part of the second heat conductor 32 is adjacent to the radial external part of the first heat conductor 30 and is made into one unit. This second heat conductor 32 is made from a material which has a lower heat conductivity than the first heat conductor 30 and can be made, for example, from stainless steel or ceramics.

A flange part 34 is arranged integrally with the front part 22B of this type of shaft 22. The flange part 34 is interlocked with an engagement concave part 24B which is formed on the side of the back face 16B of the substrate 24 of the heater plate 16. The surface position on the opposite side to the plate component 26 of the flange part 34 and the surface position on the opposite side to the plate component 26 of the substrate 24 (the position of the back surface of the substrate 24 in the direction of the axis of the shaft 22) are the same.

The edge part 24C (the radial external edge part of the engagement concave part 24B) of the engagement concave part 24B of this substrate 24 and the edge part 34A (the radial external edge part of the flange part 34) of the flange part 34 are joined by welding and by this the shaft 22 is supported by the heater plate 16.

Also, the shaft 22 has a cylinder shaped extended diameter part 36. The extended diameter part 36 is arranged integrally on the base point part 22A of the shaft 22. This extended diameter part 36 has a wider diameter than the middle part 22C of the shaft 22.

Also, the extended diameter part 36 has an O ring groove 38 which seen from the direction of the axis of the shaft 22 is circular (omitted in FIG. 2). As shown in FIG. 1, the O ring groove 38 is separated from the second heat conductor 32 within the extended diameter part 36 and is arranged in the side of the base point part 22A of the shaft 22 rather than the second heat conductor 32 and an O ring 40 (FIG. 1) is interlocked with the O ring groove 38. The size R1 of the diameter of this type of extended part 36 is smaller than the size R2 of the diameter of the flange part 34.

In the shaft 22 as explained above, the part which is on the opposite side of the heater plate 16 looking from the extended diameter part 36 is made to be the base point part 22A as already stated, and the diameter size of this base point part 22A is the same diameter size as the middle part 22C. The base point part 22A of this shaft 22 is passed through an attachment hole 15 which is arranged at the bottom wall 14A of the housing 14 and fixed, and by this, the housing 14 supports the heater plate 16 through the shaft 22. The base point part 22A of the shaft 22 in the present embodiment is formed only by the second heat conductor 32 without arranging the first heat conductor 30.

In this type of process chamber 12, the relationship which is shown in the equation (1) stated below between the heat current flow q (W), the thermal resistance value Rth (K/W) of the shaft 22, the absolute temperature of the base point part of the shaft 22 T1 (K) and the absolute temperature of the heater plate 16 T2 (K) is established.

$$T2-T1=q\times Rth \quad (1)$$

Figure 5:
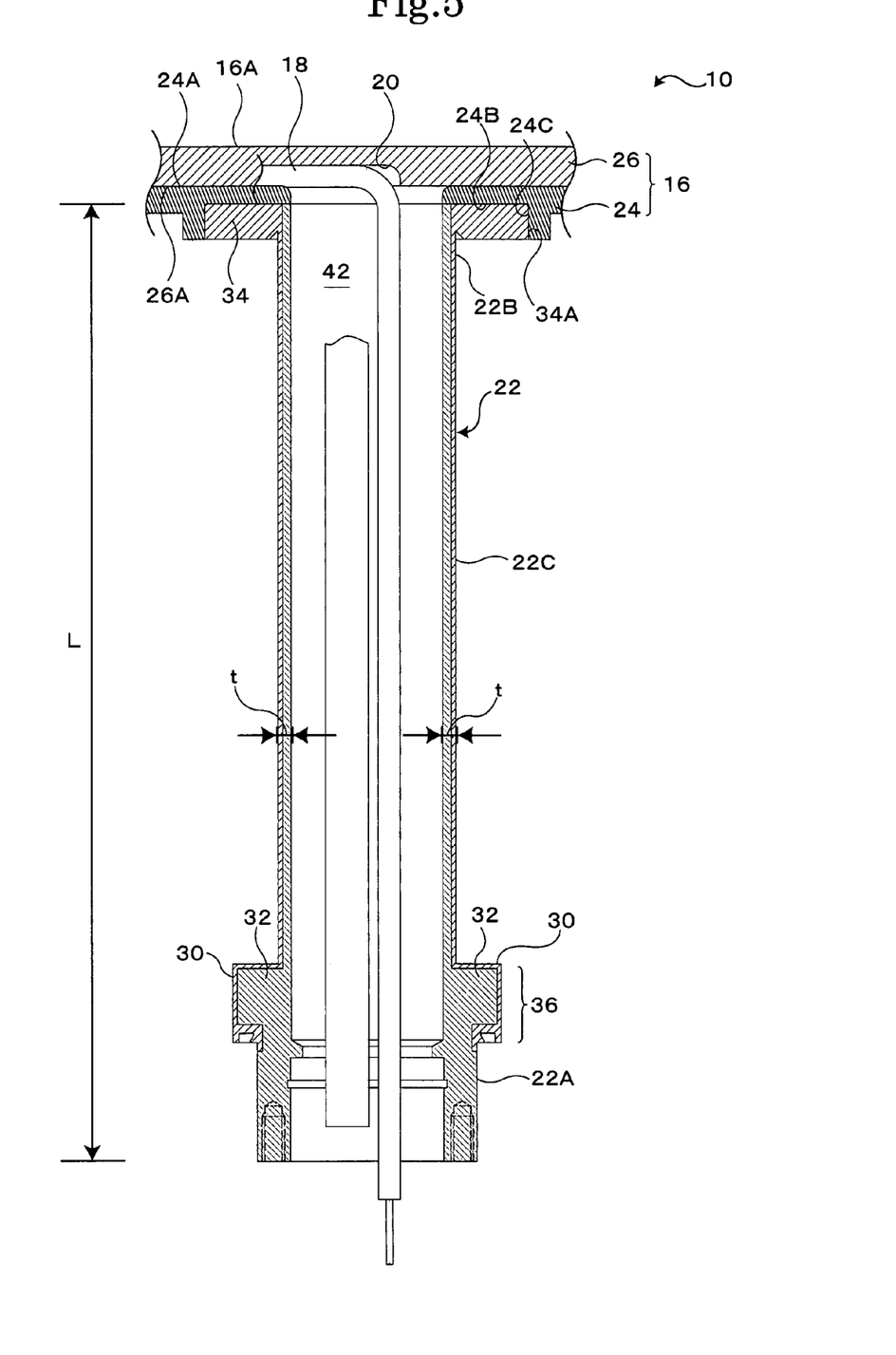
FIG. 5 is a front cross sectional diagram which shows an outline of the shaft relating to the embodiment of this invention.

Also, as shown in FIG. 5, the relationship which is shown in the following equation (2) between the size L of the shaft 22 in the direction of its axis (m), the heat transfer area S of the shaft 22 (m²) and the heat transfer ratio lambda (W/mK), is established.

$$Rth=L/(lambda \times S) \quad (2)$$

Here, in the present embodiment, the heat transfer ration lambda (W/mK) of the shaft 22 of the heater unit 10 is 180 W/mK in the case of Al alloy (A6061) at room temperature and in the case of stainless-steel (SUS304) is 16.0 W/mK at room temperature.

Also, in the shaft 22, in the case of L=200 (mm), t=3 (mm) and moreover, the shaft 22 is made of only A6061, where L is the size of the shaft 22 in the direction of its axis (mm) and t is the thickness (mm) of the middle section 22C of the shaft 22, thermal resistance value Rth of the shaft 22 is 2.51 K/W.

Also, when it is composed of a part of A6061 and a part of SUS304, thermal resistance value Rth of the shaft 22 is 8.67 K/W.

Figure 6:
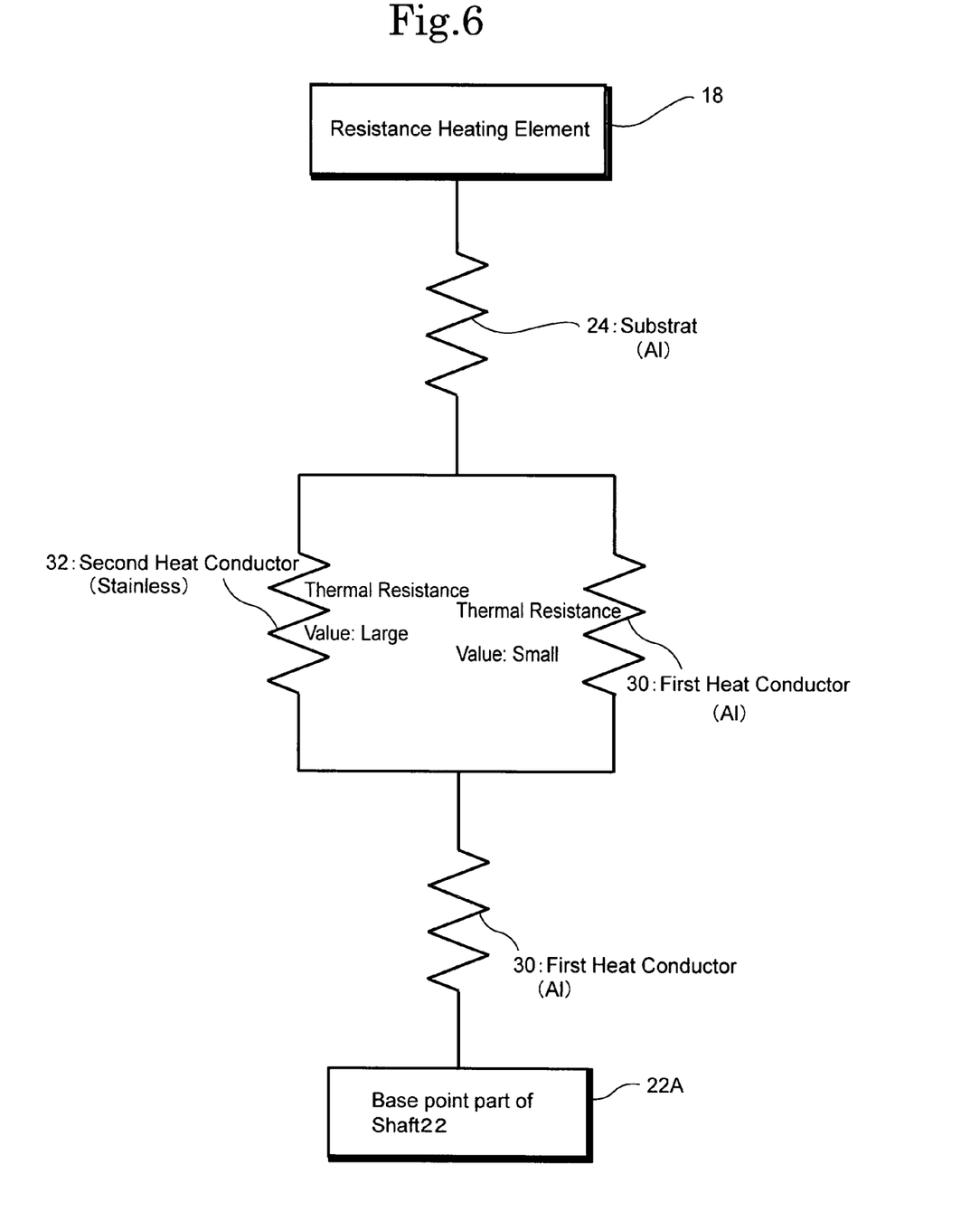
FIG. 6 is a pattern diagram which shows an outline of a thermal resistance within the heater unit relating to the embodiment of this invention.

In FIG. 6, an outline of a thermal resistance within the heater unit 10 is typically shown. In this model diagram, one end of the thermal resistance of the substrate 24 is connected in series to the resistance heating element 18 and the other end of the thermal resistance of this substrate 24 is connected in parallel to one end of the thermal resistance of the first heat conductor 30 and one end of the thermal resistance of the second heat conductor 32. The other end of the thermal resistance of the first heat conductor 30 and the other end of the thermal resistance of the second heat conductor 32 are connected to one end of the thermal resistance of the first heat conductor 30, and this other end of the thermal resistance of the first heat conductor 30 is connected to the base point part 22A of the shaft 22. As a result, it has composition in the case where the resistance heating element 18 is in a heated state, the heat generated by the resistance heating element 18 is transferred through the heater plate 16 to the part where the thermal resistance of the first heat conductor 30 and the thermal resistance of the second heat conductor 32 are connected in parallel with each other, and most of that heat passes through the first heat conductor 30 which has a small thermal resistance value and reaches the base point part 22A of the shaft 22 via the lower part (the part which is nearer to the base point part 22A of the shaft 22 rather than to the parallel connection part of the first heat conductor 30 and second heat conductor 32) of the first heat conductor 30.

Next, the operation of this embodiment will be explained.

Electric current flows or doesn't flow, and is controlled in the resistance heating element 18 in the process chamber 12, so that the resistance heating element can be switched between heated and non-heated.

Figure 7:
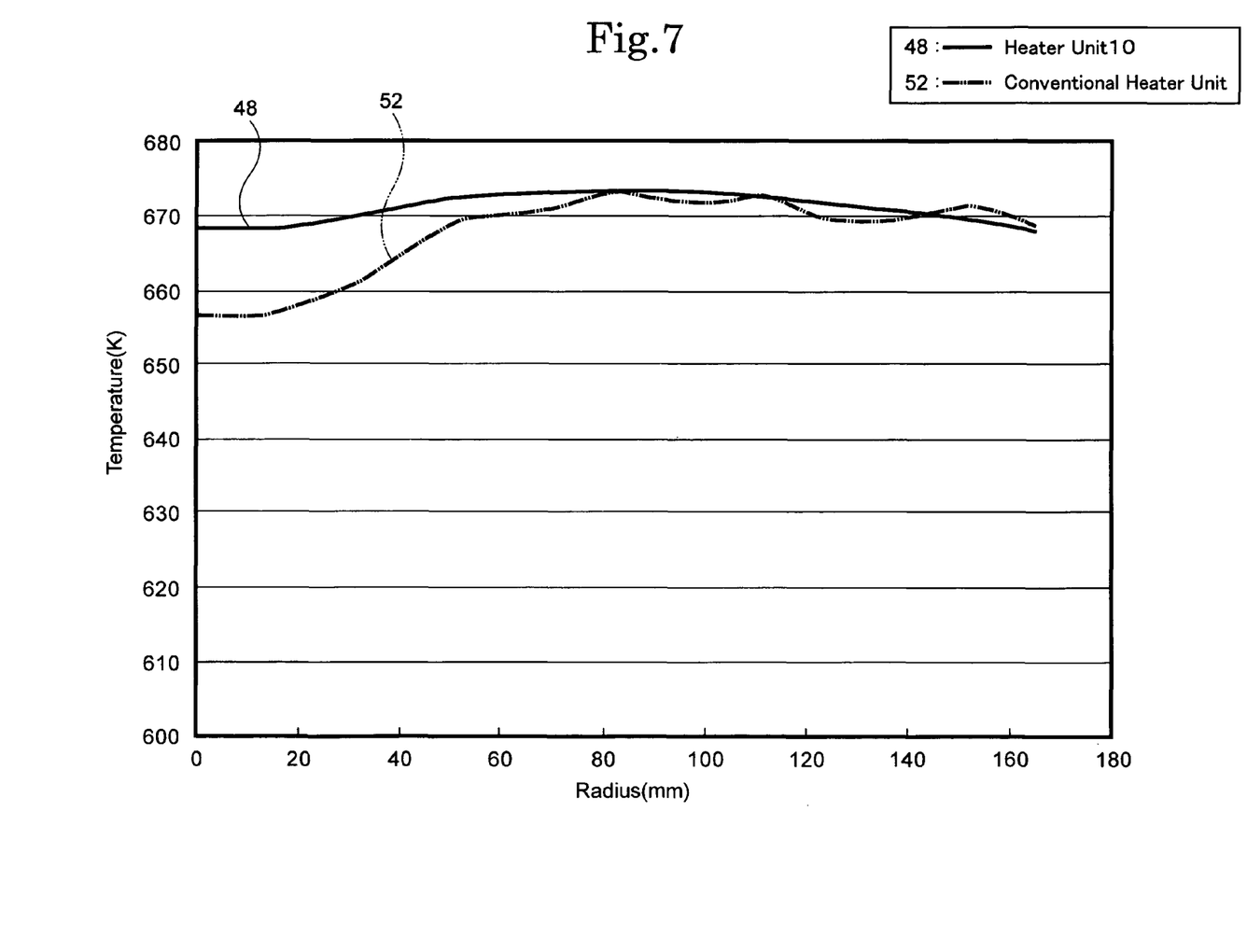
FIG. 7 is a graph which shows a relationship between the size up to the measurement point from the diameter center position and the temperature measurement upon the heater plate relating to an embodiment of this invention.

Here, the second heat conductor 32 which is the radial internal part of the shaft 22 has a lower heat conductivity ratio than the first heat conductor 30 which is the radial external part of shaft 22. Because of this, in the case where the state of the resistance heat element 18 is repeatedly switched between heated and non-heated, the movement of heat from the front part 22B of the shaft 22 to the side of the base point part 22A, is more suppressed in the second heat conductor 32 compared to the first heat conductor 30. Consequently, in a part which confronts the hollow part 42 (the opening which is formed along the direction of the axis of the shaft 22) formed within the shaft 22 in the heater plate 16, the time required to heat the heater plate 16 and in addition the wafer 28 to be heated until the desired heating temperature is shortened when compared to a conventional heater unit. As can also be understood from a comparison of the temperature measurement curve 52 of the conventional heater unit, in the heater plate 16, the temperature drop around the center of the diameter is controlled compared to the radial external part. As a result, the uniformity of the temperature of the wafer 28 which is to be heated by the heater plate 16 can be improved.

Also, in the heater unit 10, a flange part 34 is arranged in the front part 22B of the shaft 22. Because of this, when the flange part 34 is interlocked with the engagement concave part 24B of the heater plate 16, for example, the heater plate 16 is placed the engagement concave part 24B up, and then, the flange part 34 of the shaft 22 is aligned and engaged with the engagement concave part 24B of the heater plate 16 placed as stated above. Therefore, for example, in the case where the shaft 22 is joined to the heater plate 16 by welding or soldering, a component which fixes the heater place 16 is no longer necessary and by this the shaft 22 can easily be joined to the heater plate 16. Also, at this time, compared to the case when a flange part 34 is not arranged on the shaft 22, because the size (the size along the radial direction of the shaft 22) from the edge part 34A of the flange part 34 (the radial external edge part of the flange part 34) of the shaft 22 up to the border part between the first heat conductor 30 and the second heat conductor 32 is large, the distortion which is due to the heat produced by welding flange part 34 to the heater plate 16 is absorbed (diffused). Therefore, it is possible to suppress the distortion produced by the border part between the above stated first heat conductor 30 and second heat conductor 32.

Also, the O ring groove 38 of the extended diameter part 36 is arranged on the side of the base point part 22A of the shaft 22 in the axis direction of the shaft 22 rather than the second heat conductor 32 within the extended diameter part 36. As a result, the heat moved from the front part 22B (side of the heater plate 16) of the shaft 22 to the base point part 22A is maintained by the second heat conductor 32 within the extended diameter part 36, the heat deformation of the O ring 40 which is interlocked with the O ring groove 38 is reduced and there is no longer a need to cool this O ring 40. Therefore, a member with a lower allowable temperature limit than conventional can be applied as an O ring 40 which is interlocked with O ring groove 38.

Also, in the heater unit 10, the size R1 of the diameter of the extended diameter part 36 is smaller than the size R2 of the diameter of the flange part 34. As a result, for example, in the case where the shaft 22 is joined to the heater plate 16 by electron beam welding, it is possible to expose the electron beam in order to weld along the direction of the shaft axis facing the flange part from the base point part 22A of the shaft 22 rather than the extended diameter part 36. Therefore, the joining of the shaft 22 and the heater plate 16 (the joining of the edge part 24C of the engaged concave part 24B of the heater plate 16 and the edge part 34A of the flange part 34 of the shaft 22) becomes even easier.

Also, for example, in the case where the first heat conductor 30 is aluminum and the second heat conductor 32 is stainless steel, or in the case where the first heat conductor 30 is aluminum and the second heat conductor 32 is ceramic the strength of the shaft 22 can be improved more than conventional shafts (for example, a shaft which is formed by a single material such as a shaft formed by only aluminum)

Figure 8:
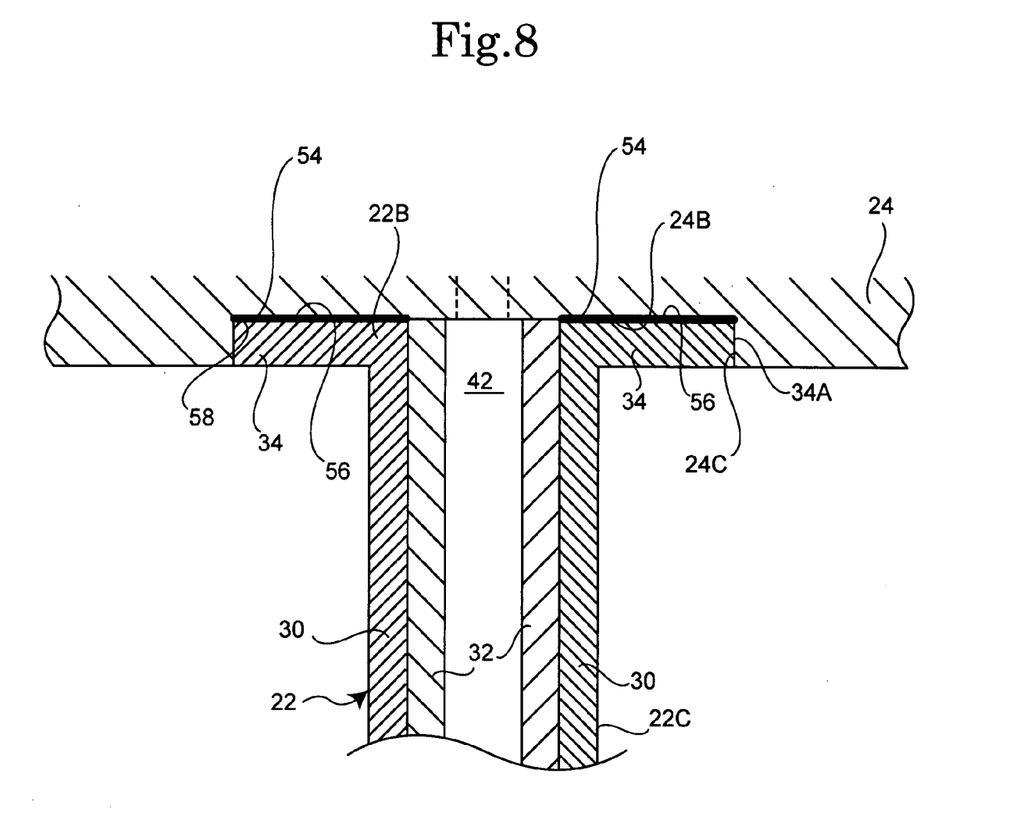
FIG. 8 is front cross sectional diagram which shows an example of a shaft and heater plate which have been joined by soldering.

Further, in the present embodiment, the flange part 34 of the shaft 22 was given as joined to the substrate 24 of the heater plate 16 by welding, however, in the present invention, instead of this, the entire flat surface 56 (the flat surface which is one of a pair of toric surfaces of the flange part 34 and is on the opposite side of the base point part 22A of the shaft 22) of the side of the plate component 26 of the flange part 34 can be joined to the flat surface 58 (the flat surface part excluding the edge part 24C among the engaged concave part 24B) of the substrate 24 of the heater plate 16 by soldering (referring to the solder part 54 in FIG. 8) as shown in FIG. 8.

Figure 9:
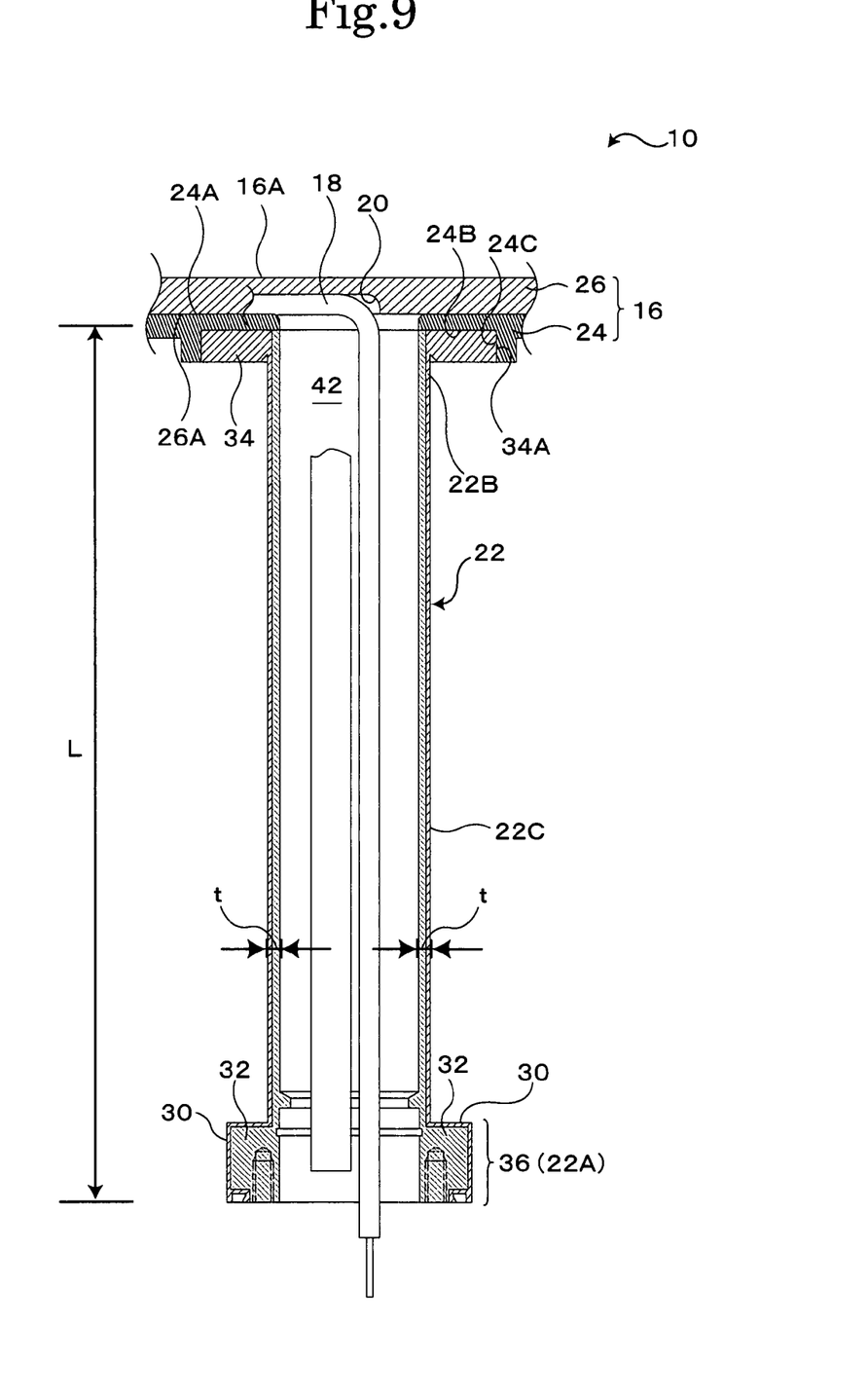
FIG. 9 is a modification of a shaft relating to an embodiment of this invention.

Also, in the present embodiment, the base point part 22A of the shaft 22 was given as the part which is on the side opposite to the middle section 22C towards the extended diameter part 36, however, as shown in FIG. 9, the extended diameter part 36 can be made to be the base point part 22A by omitting the part which is on the opposite side of the middle section 22C towards the above stated extended diameter part 36 of the shaft 22.

[Modification 1]

Figure 10:
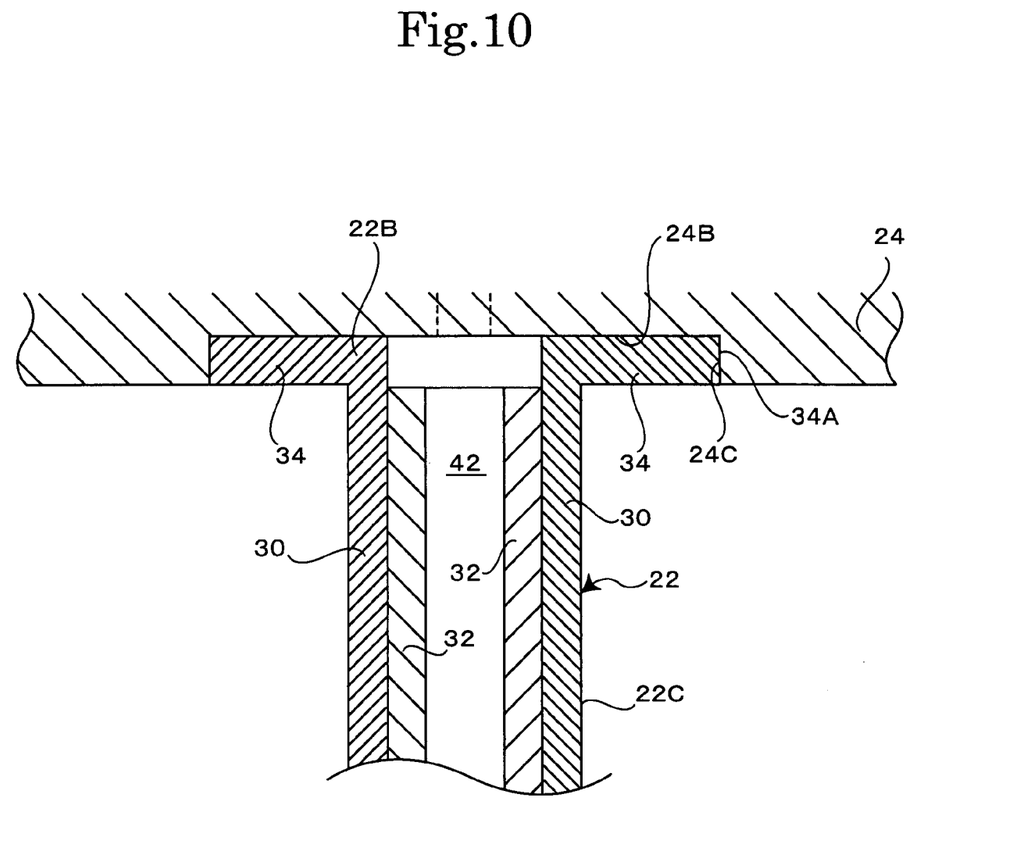
FIG. 10 is a modification of a shaft relating to an embodiment of this invention.

In a heater unit 10 related to a first modification of this invention, as shown in FIG. 10, the surface position of the second heat conductor 32 in the front part 22B of the shaft 22 is made to be nearer to the side of the base point part 22A of the shaft 22 compared to the surface position of the first heat conductor 30 in the front part 22B of the shaft 22.

For this reason, for example, when the second heat conductor 32 and the heater plate 16 are separated, the movement of heat between the heater plate 16 and the second heat conductor 32 is suppressed. Therefore, even if the resistance heating element 18 is switched from a heated state to a non-heated state, the once heated second heat conductor is difficult to become cold and also after this even if the resistance heating element 18 is switched from a non-heated state to a heated state, the temperature difference until a desired temperature is reached becomes smaller than conventional. Consequently, the area which confronts the hollow part 42 (the opening formed in the direction of the axis of shaft 22) which is formed within the shaft 22 in the heater plate 16 is quickly heated to the desired temperature.

[Modification 2]

Figure 11:
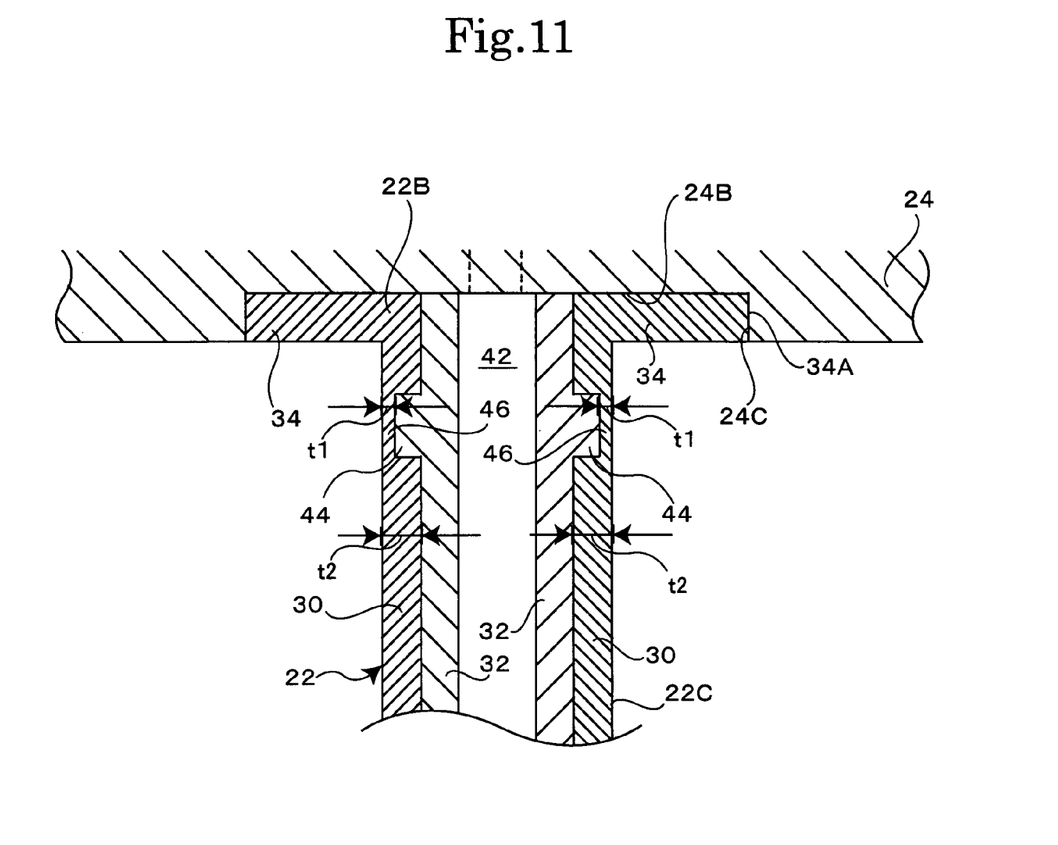
FIG. 11 is a modification of a shaft relating to an embodiment of this invention.

A heater unit 10 related to a second modification of the present invention, as shown in FIG. 11, by making the thickness of a part of the first heat conductor 30 of the shaft 22 small, the thermal resistance ratio of the part of the first heat conductor 30 along the direction of the axis of the shaft 22 is made larger than other parts.

In this type of heater unit 10, the second heat conductor 32 has a projection part 44 which is projected out to the exterior of the diameter of the shaft 22.

Also, the first heat conductor 30 has a thin wall part 46 which accommodates the projection part 44. The size t1 of this thin wall part 46 is smaller than the size t2 of the thickness of the part which does not accommodate the projection part 44 of the first heat conductor 30.

As a result of this, the thermal resistance value of the thin wall part 46 of the first heat conductor 30 becomes larger compared to other parts (the part which does not accommodate the projection part of the second heat conductor 32 among the first heat conductor 30) and by this, the movement of heat from the front part 22B of the shaft 22 (side of the heater plate 16) to the side of the base point part 22A is suppressed. Therefore, in the part which confronts the hollow part 42 (the opening which is formed along the direction of the axis of the shaft 22) which is formed within the shaft 22 in the heater plate 16, the time until the desired heating temperature is reached in the heater plate 16 and thus the wafer 28 to be heated, is shortened when compared to a conventional heater unit. By this it is possible to improve still further the uniformity of the temperature of the wafer 28 which is to be heated by the heater plate 16.

What is claimed is:

1. A heater unit comprising:
a heater plate which has a heating element which is able to switch between a heated state and a non-heated state and heats an object to be heated by making the heating element a heated state; and
a shaft which is roughly a tube shape wherein a radial external part which is formed by a first heat conductor and a radial internal part which is formed by a second heat conductor whose heat conduction ratio is lower than the first heat conductor and has one end part which is engaged with the heater plate and supports the heater plate,
wherein the second heat conductor has a projection part which projects out towards the exterior of the shaft's diameter, and the first heat conductor has a concave part which accommodates the projection part and whose wall thickness size is smaller than the other part which does not accommodate the projection part.

2. The heater unit cited in claim 1, wherein a flange part is arranged at one end part of the shaft and engages the heater plate.

3. The heater unit cited in claim 1, wherein the shaft has an expanded diameter part whose diameter is wider than the middle section of the shaft and is arranged at the other end of the shaft, and wherein the expanded diameter part has an O ring groove interlocked with an O ring, the O ring groove is separated from the second heat conductor and is arranged on the side of the other end part of the shaft rather than the second heat conductor within said expanded diameter part.

4. The heater unit cited in claim 1, wherein a flange part which is engaged with the heater plate is arranged at one end of the shaft, wherein the shaft has an extended diameter part whose diameter is wider than the middle section of the shaft and is arranged on the side of the other end of the shaft, and wherein the expanded diameter part has an O ring groove interlocked with an O ring, the O ring groove is separated from the second heat conductor and is arranged on the side of the other end part of the shaft rather than the second heat conductor within said expanded diameter part.

5. The heater unit cited in claim 4, wherein the diameter size of the extended diameter part is smaller than the diameter size of the flange part.

6. The heater unit cited in claim 1, wherein the shaft is roughly a cylindrical shape having a hollow inside thereof, and the heating element is routed though the hollow of the shaft to the heating plate.

7. The heater unit cited in claim 6, wherein the heater plate is roughly a circular disc, and wherein the heating element is arranged so that it extends concentrically from the center of the shaft center toward the radial exterior of the heater plate.

8. The heater unit cited in claim 1, wherein the heater plate includes a plate component having a groove for housing the heating element and a substrate put on the plate component to cover the groove.

9. The shaft cited in claim 1, wherein a flange part which is engaged with the heater plate is arranged to one end of the shaft, wherein an extended diameter part whose diameter is wider than the middle section of the shaft is arranged on the side of the other end of the shaft, and wherein the expanded diameter part has an O ring groove interlocked with an O ring, the O ring groove is separated from the second heat conductor and is arranged on the side of the other end part of the shaft rather than the second heat conductor within said expanded diameter part.

10. The shaft unit cited in claim 9, wherein the diameter size of the extended diameter part is smaller than the diameter size of the flange part.

11. A shaft to be connected with a heater plate having a heating element to form a heater unit comprising:
   a tube body with a radial external part which is formed by a first heat conductor and a radial internal part which is formed by a second heat conductor whose heat conduction ratio is lower than the first heat conductor,
   wherein the second heat conductor has a projection part which projects out towards the exterior of the shaft's diameter, and the first heat conductor has a concave part which accommodates the projection part and whose wall thickness size is smaller than the other part which does not accommodate the projection part.

12. The shaft cited in claim 11, wherein a flange part is arranged at one end part of the shaft and engages the heater plate.

13. The shaft cited in claim 11, wherein an expanded diameter part whose diameter is wider than the middle section of the shaft is arranged at the other end of the shaft, and wherein the expanded diameter part has an O ring groove interlocked with an O ring, the O ring groove is separated from the second heat conductor and is arranged on the side of the other end part of the shaft rather than the second heat conductor within said expanded diameter part.

14. The shaft cited in claim 11, wherein the tube body is cylindrical and has a hollow thorough which the heating element is routed.

15. A heater unit comprising:
   a heater plate which has a heating element which is able to switch between a heated state and a non-heated state and heats an object to be heated by making the heating element a heated state; and
   a shaft which is roughly a tube shape wherein a radial external part which is formed by a first heat conductor and a radial internal part which is formed by a second heat conductor whose heat conduction ratio is lower than the first heat conductor and has one end part which is engaged with the heater plate and supports the heater plate,
   wherein an upper surface of the second heat conductor at one end of the shaft is apart from the heater plate, and there is a void between the upper surface of the second heat conductor and the heater plate.

16. The heater unit cited in claim 15, wherein a flange part which is engaged with the heater plate is arranged at one end of the shaft, wherein the shaft has an extended diameter part whose diameter is wider than the middle section of the shaft and is arranged on the side of the other end of the shaft, and wherein the expanded diameter part has an O ring groove interlocked with an O ring, the O ring groove is separated from the second heat conductor and is arranged on the side of the other end part of the shaft rather than the second heat conductor within said expanded diameter part.

17. The heater unit cited in claim 16, wherein the diameter size of the extended diameter part is smaller than the diameter size of the flange part.

18. A shaft to be connected with a heater plate having a heating element to form a heater unit comprising:
   a tube body with a radial external part which is formed by a first heat conductor and a radial internal part which is formed by a second heat conductor whose heat conduction ratio is lower than the first heat conductor,
   wherein an upper surface of the second heat conductor at one end of the shaft is apart from the heater plate, and there is a void between the upper surface of the second heat conductor and the heater plate.

19. The shaft cited in claim 18, wherein a flange part which is engaged with the heater plate is arranged to one end of the shaft, wherein an extended diameter part whose diameter is wider than the middle section of the shaft is arranged on the side of the other end of the shaft, and wherein the expanded diameter part has an O ring groove interlocked with an O ring, the O ring groove is separated from the second heat conductor and is arranged on the side of the other end part of the shaft rather than the second heat conductor within said expanded diameter part.

20. The shaft unit cited in claim 19, wherein the diameter size of the extended diameter part is smaller than the diameter size of the flange part.

* * * * *